(12) United States Patent
Hall

(10) Patent No.: US 7,252,773 B2
(45) Date of Patent: Aug. 7, 2007

(54) CLEAN FOR HIGH DENSITY CAPACITORS

(75) Inventor: Lindsey H. Hall, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 377 days.

(21) Appl. No.: 10/269,498

(22) Filed: Oct. 11, 2002

(65) Prior Publication Data

US 2004/0072441 A1    Apr. 15, 2004

(51) Int. Cl.
    H01L 21/302    (2006.01)
    H01L 21/461    (2006.01)

(52) U.S. Cl. .................... 216/6; 134/1.1; 438/710; 257/E21.009

(58) Field of Classification Search .................. 216/6, 216/49, 57, 67, 75; 134/1.1, 2; 438/704, 438/720, 725
    See application file for complete search history.

(56) References Cited

U.S. PATENT DOCUMENTS

| | | | | |
|---|---|---|---|---|
| 5,843,821 A | * | 12/1998 | Tseng | 438/253 |
| 5,879,986 A | * | 3/1999 | Sung | 438/253 |
| 6,100,135 A | * | 8/2000 | Wu | 438/253 |
| 6,348,386 B1 | | 2/2002 | Gilmer | |
| 6,482,740 B2 | * | 11/2002 | Soininen et al. | 438/686 |
| 6,486,530 B1 | * | 11/2002 | Sasagawa et al. | 257/532 |
| 6,656,748 B2 | * | 12/2003 | Hall et al. | 438/3 |
| 2001/0041250 A1 | | 11/2001 | Werkhoven et al. | |
| 2002/0004279 A1 | | 1/2002 | Agarwal et al. | |

\* cited by examiner

*Primary Examiner*—Allan Olsen
(74) *Attorney, Agent, or Firm*—Jacqueline J. Garner; W. James Brady, III; Frederick J. Telecky, Jr.

(57) ABSTRACT

One aspect of the invention relates to a method of cleaning high density capacitors. According to the method, the capacitors are cleaned with a plasma that includes fluorine-containing radicals. The plasma removes a small layer from the capacitors, including their sidewalls, and thereby removes surface contaminants. The method is effective even when the capacitors include hard-to-etch dielectric materials, such as tantalum and hafnium oxides. In a preferred embodiment, the plasma clean is combined with a solvent clean.

20 Claims, 3 Drawing Sheets

CLEAN FOR HIGH DENSITY CAPACITORS

FIELD OF THE INVENTION

The present invention relates generally to the field of integrated circuit processing, and more particularly relates to a method of manufacturing high density capacitors.

BACKGROUND OF THE INVENTION

Although integrated circuit devices have become progressively more compact in recent years, there continues to be a demand for still more compact devices. Higher density device elements that lend themselves to formation into compact devices are continuously sought. One device element for which higher density is sought is a capacitor.

To make integrated circuits with high density capacitors, there is a need for new semiconductor device manufacturing processes. High density capacitors require high-k dielectric materials such as tantalum pentoxide. Making capacitors with materials such as tantalum pentoxide presents process integration challenges. Such materials are incompatible with many other materials and are difficult to etch. Moreover, smaller, thinner capacitors are more sensitive to non-uniformities and contamination than their thicker counterparts. The foregoing challenges illustrate a long felt need for improved processes for making semiconductor devices having high density capacitors.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the in a simplified form as a prelude to the more detailed description that is presented later.

One aspect of the invention relates to a method of cleaning high density capacitors. According to the method, the capacitors are cleaned with a plasma that includes fluorine-containing radicals. The plasma removes a small layer from the capacitors, including their sidewalls, and thereby removes surface contaminants. The method is effective even when the capacitors include hard-to-etch dielectric materials, such as tantalum and hafnium oxides. In a preferred embodiment, the plasma clean is combined with a solvent clean.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DESCRIPTION OF THE INVENTION

Figure 1:
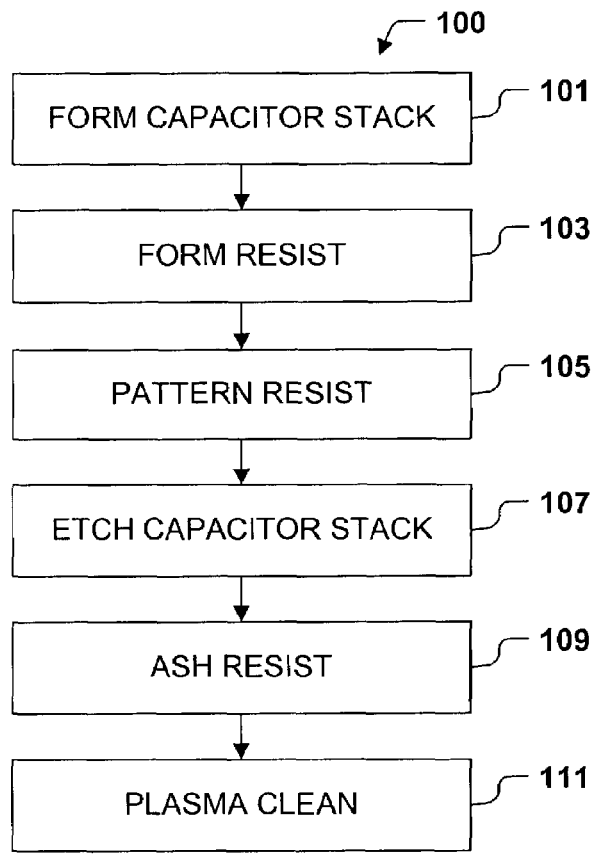
FIG. 1 is a flow chart illustrating a process according to one aspect of the present invention.

The present invention will now be described with reference to the attached drawings, wherein like reference numerals are used to refer to like elements throughout. FIG. 1 is a flow chart of a process 100 for post ash cleaning capacitors according to one aspect of the present invention. Although the method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented, for example, in association with the operation of mixed signal type integrated circuit devices as well as in association with other structures not illustrated or discussed.

Process 100 includes forming a capacitor stack over a semiconductor substrate, act 101, forming a resist over the capacitor stack, act 103, patterning the resist, act 105, etching the capacitor stack to form capacitors, act 107, ashing the resist, act 109, and cleaning the capacitors with a fluorine-containing plasma, act 111. The plasma clean is effective in removing contaminants that result from the etch and ash processes.

A semiconductor substrate comprises a semiconductor, typically silicon. Other examples of semiconductors include GaAs and InP. In addition to a semiconductor, the substrate may include various elements therein and/or layers thereon. These can include metal layers, barrier layers, dielectric layers, device structures, active elements and passive elements including silicon gates, word lines, source regions, drain regions, bit lines, bases, emitters, collectors, conductive lines, conductive vias, etc.

The capacitor stack includes at least a top electrode layer, a dielectric core, and a bottom electrode layer. The capacitor stack may also include additional layers, such as diffusion barrier layers. In one embodiment, the dielectric core includes a high-k dielectric. Examples of high-k dielectrics include silicates, aluminates, titanates, and metal oxides. Examples of silicate high-k dielectrics include silicates of Ta, Al, Ti, Zr, Y, La and Hf, including Zr and Hf doped silicon oxides and silicon oxynitrides. Examples of aluminates include transition metal aluminates, such as compounds of Zr and Hf. Examples of titanate high-k dielectrics include $BaTiO_3$, $SrTiO_3$, and $Pb(Zr,Ti)O_3$ (PZT). Examples of metal oxide high-k dielectrics include oxides of refractory metals, such as Zr and Hf, and oxides of Lanthanide series metals, such as La, Lu, Eu, Pr, Nd, Gd, and Dy. Additional examples of metal oxide high-k dielectrics include $Al_2O_3$, $TiO_2$, $Nb_2O_5$ and $Y_2O_3$. In a further embodiment, the high-k dielectric is selected from the group consisting of hafnium oxides and tantalum oxides. Typically, a hafnium oxide is $HfO_2$ and a tantalum oxide is $Ta_2O_5$.

The top and bottom electrode layers can include one or more sub-layers of any suitable material. Examples of suitable materials for electrode sub-layers include Pt, Pd, Au, Ag, Ir, Rh, Ru and oxides thereof. Specific examples include, without limitation, Pt, Pd, $PdO_x$, IrPt alloys, Au, Ru, $RuO_x$, $(Ba,Sr,Pb)RuO_3$, $(Sr,Ba,Pb)IrO_3$, Rh, $RhO_x$, $LaSrCoO_3$, $(Ba,Sr)RuO_3$, or $LaNiO_3$ In one embodiment, an electrode sub-layer is oxidation resistant, whereby it is compatible with a $Ta_2O_5$ dielectric core. Examples of oxidation resistant electrode sub-layers include TiN, TiAlN, TiAlON, and $IrO_2$ sub-layers.

The electrode layers are preferably from about 10 to about 200 nm thick, more preferably from about 20 to about 100 nm thick, and still more preferably from about 27 to about 55 nm thick. The dielectric core is preferably from about 10 to about 150 nm thick, more preferably from about 15 to about 100 nm thick, and still more preferably from about 21 to about 30 nm thick. The electrode layers and dielectric core can be formed by any suitable processes, including for example, sputter deposition and/or CVD.

After forming the capacitor stack, the capacitor stack is lithographically patterned by acts 103, 105, and 107. Lithography refers to processes for pattern transfer between various media. In lithography for integrated circuit fabrication, the substrate is coated uniformly with a radiation-sensitive film, the resist. The film is selectively exposed with radiation (such as visible light, ultraviolet light, x-rays, or an electron beam) through an intervening master template, the mask or reticle, forming a particular pattern. Exposed areas of the coating become either more or less soluble than the unexposed areas, depending on the type of coating, in a particular solvent developer. The more soluble areas are removed with the developer in a developing step. The less soluble areas remain on the substrate forming a patterned coating. The pattern of the coating corresponds to the image, or negative image, of the reticle. Act 103 is forming the resist coating. Act 105 is exposing the resist to actinic radiation through a patterned mask and developing to form a patterned resist.

Act 107 is etching the capacitor stack using the patterned resist as an etch mask. Any suitable etch process can be used. For example, the capacitor stack may be etched with a plasma. The plasma composition depends on the materials being etched and may vary between layers of the capacitor stack.

After the capacitor stack has been etched to form one or more capacitors, the resist is ashed with act 109. Ashing is a process of breaking down the bonds of the resist to facilitate its removal. Typically, the resist is ashed with a plasma that includes oxygen-containing compounds.

Optionally, a solvent can be used to remove resist ash either before or after act 111, the plasma clean. Optionally, the solvent is one of those commercially available and marketed for removing resist ash, for example EKC265, EKC270, EKC311, EKC325, ACT-935, ACT-937, ACT-970, ACT NE-14, ACT NE-28, ACT N-396, ACT NE-89, BAKER REZI-28, or BAKER ALEG-310. In one embodiment, the solvent is one such as ACT NE-14, which does not unduly affect tungsten plugs, which may be present in the substrate. Preferably, the solvent is non-aqueous.

With or without a solvent clean, acts 107 and 109 can leave contaminants on the capacitors, including the capacitor side walls. Etching tends to produce metal-containing contaminants whereas ashing an organic resist can leave organic polymer contaminants. The resist and etch by-products can combine to produce other types of contaminants. Act 111, the plasma clean, removes contaminants almost regardless of type by removing a thin outer layer from the one or more capacitors.

In one embodiment, the plasma clean removes from about 5 to about 100 Å of material from the capacitor sidewalls. In another embodiment, the plasma clean removes from about 7 to about 50 Å of material. In a further embodiment, the plasma clean removes from about 10 to about 30 Å of material.

Figure 2:
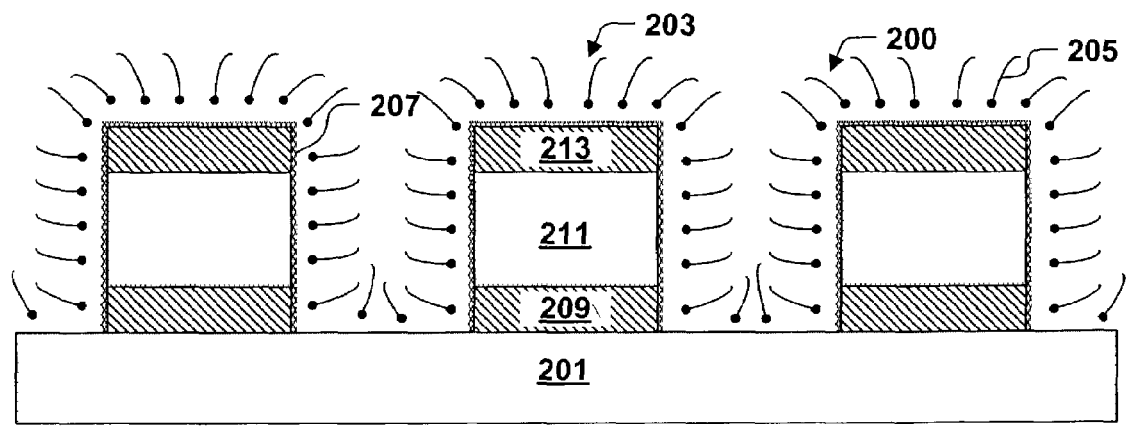
FIG. 2 is a high level schematic illustrating a process of the present invention.

FIG. 2 illustrates the plasma clean. In FIG. 2, device 200, which includes substrate, 201 and capacitor stacks 203, is exposed to plasma 205 generated from a remote source. The plasma 205 removes an outer layer 207 of the capacitor stacks 203, including material from bottom electrode layer 209, dielectric core 211, and top electrode layer 213.

The plasma employed in act 111 includes fluorine-containing radicals, such as fluoride radicals, produced from a fluorine-containing compound. Examples of fluorine-containing compounds include fluorocarbons. Examples of fluorocarbons include perfluorocarbons, such as $CF_4$, $C_2F_6$, $C_3F_6$, $C_3F_8$, $C_4F_8$, $C_4F_{10}$, $C_5F_8$, $C_6F_{14}$, and $C_6F_5CF_2CFCF_2$, hydrofluorocarbons, such as $CH_3F$, $CH_2F_2$, $CHF_3$, $CH_3CHF_2$, $CHF_2CF_3$, $CH_2FCF_3$, $C_2H_3F_3$, $C_3HF_7$, and, $C_6F_5CHCH_2$. Additional examples of fluorine-containing compounds include $CCl_2F_2$, $CFCl_3$, $NF_3$, $SF_6$, $CF_3CFOCF_2$, $CF_3Br$, and HF.

The plasma also generally includes oxygen-containing radicals produced from an oxygen-containing compound. Examples of oxygen-containing compounds include oxygen, ozone, carbon monoxide, nitrous oxide and nitric oxide. Preferably, the atmosphere from which the plasma is produced contains fluorine-containing compounds and oxygen-containing compounds in a volume ratio of from about 1:1 to about 1:1000, more preferably from about 1:5 to about 1:300, and still more preferably from about 1:20 to about 1:100. The atmosphere may contain additional components. Preferably the atmosphere includes, based on the source gas feed rates, at least about 0.1 mole % of the fluorine-containing compound, more preferably at least about 0.5 mole %. Preferably the atmosphere includes at least about 10 mole % of the oxygen-containing compound, more preferably at least about 20 mole %, more preferably at least about 50 mole %.

Plasma etching generally takes place at reduced pressure. Preferably, the pressure is less than about 100 torr, more preferably less than about 10 torr, still more preferably less than about 1 torr. Any suitable temperature can be employed, for example, a temperature in the range from about 20 to about 100° C.

Figure 3:
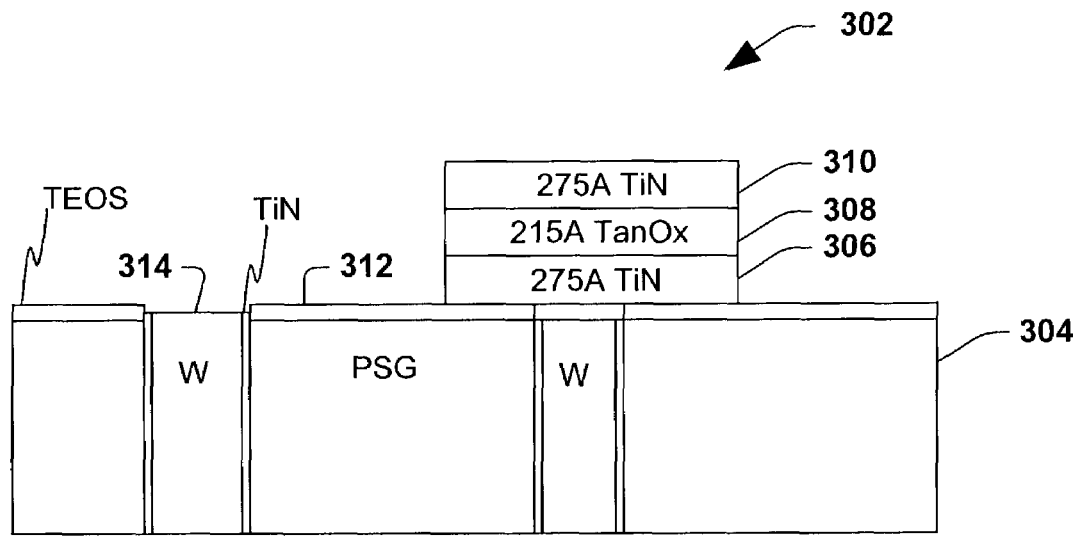
FIG. 3 is a fragmentary cross section diagram illustrating a capacitor stack to be clean in accordance with the present invention.

As an example, as illustrated in FIG. 3, a capacitor stack 302 is formed on a substrate such as a phosphosilicate glass (PSG) dielectric 304 by successively depositing a 275 Å TiN bottom electrode layer 306, a 215 Å $Ta_2O_5$ dielectric core 308, and a 275 Å TiN top electrode layer 310. Plasma etching using an organic positive-tone UV resist mask patterns the capacitor stack into a capacitor. The resist is ashed and the substrate cleaned with NE-14. Thereafter, the device is further cleaned at a temperature of about 60° C. with a remote plasma. The plasma is generated from $CF_4$, supplied at 60 sccm, and $O_2$, supplied at 2000 sccm, at a pressure of 0.7 torr using 1200 Watts of power. Cleaning removes substantially all contaminants from the capacitor sidewalls and is also effective with the plasma and solvent cleaning steps reversed.

The remote plasma etch is generally isotropic and therefore attacks the sidewall residue and/or contaminants effectively. The fluoride plasma provides the sidewall clean with minimal attack on any exposed oxide 312 (such as TEOS, for example) and any exposed tungsten plugs 314, as illustrated. The clean also is effective to remove oxidized TiN (if employed) on a top portion of the electrode 310 that advantageously facilitates low resistance connectivity thereto.

Figure 4:
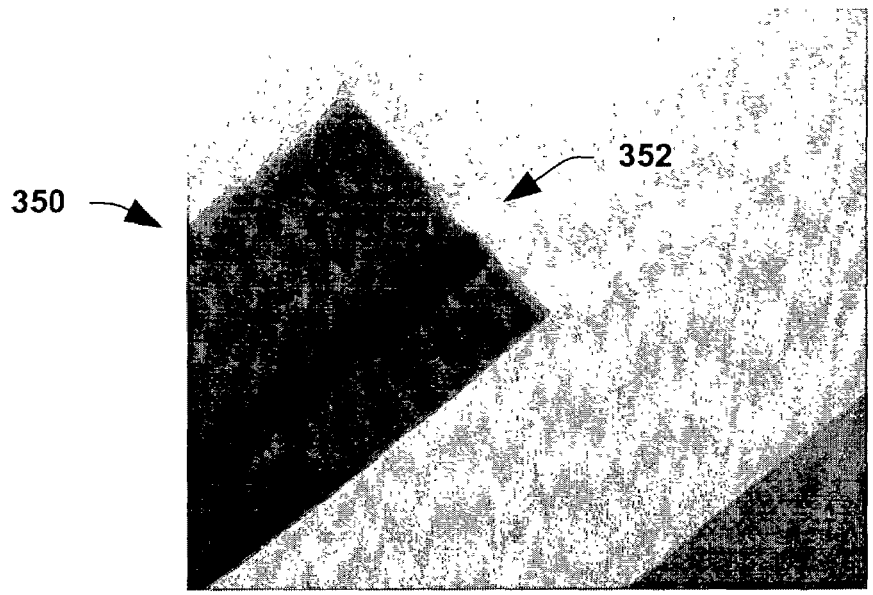
FIGS. 4-6 are SEM photographs illustrating capacitor stacks both pre and post clean to illustrate advantages associated with the process of the present invention.
Figure 5:
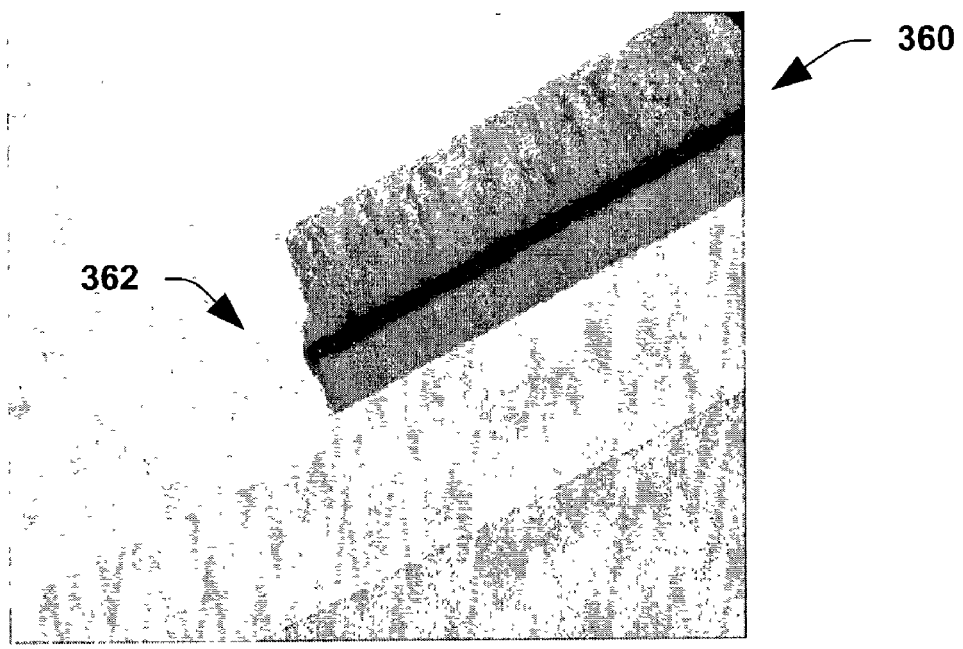
Figure 6:
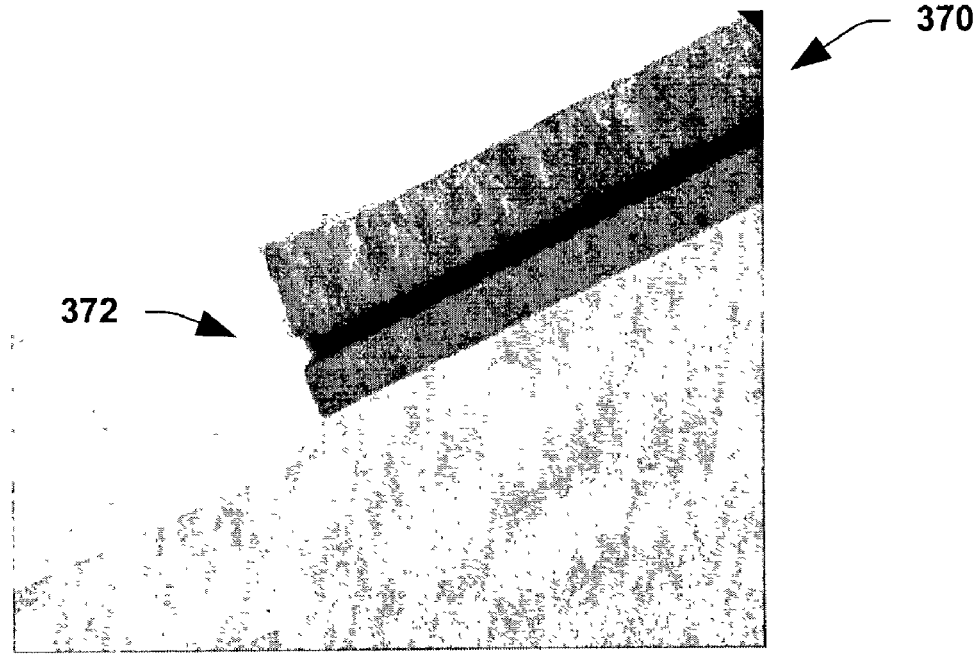

Actual pictures of exemplary capacitor stacks pre and post clean are provided in FIGS. 4-6, respectively. For example, as illustrated in FIG. 4, after a stack etch and before any clean in accordance with the present invention, a capacitor stack 350 has polymer residue and/or conductive contaminants on a capacitor sidewall 352. As discussed supra, such residue and/or contamination can disadvantageously cause leakage or even render a capacitor inoperable due to capacitor shorting. FIG. 5 illustrates a capacitor stack 360 after a remote plasma $CF_4/O_2$ clean with $CF_4$ supplied at 10 sccm for 10 seconds. Note that a sidewall 362 of the capacitor stack 360 is substantially free of residue and/or contaminants. Similarly, in FIG. 6, a capacitor stack 370 has been clean with $CF_4/O_2$ plasma with $CF_4$ supplied at 60 sccm for 30 seconds. In such a case, a sidewall 372 associated therewith is substantially free of residue and/or contaminants.

In reviewing FIGS. 5 and 6, it is seen that by varying gas flow rates and/or etch times, residue and contaminants are still removed in an effective manner, however, an impact on the remaining capacitor sidewall profile may differ. Thus, based on a desired resultant capacitor sidewall profile, or on subsequent processing requirements, the clean operation of the present invention may be varied or tailored to obtain a desired profile.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming and post ash cleaning a high density capacitor, comprising:
    providing a capacitor stack on a substrate, the capacitor stack comprising a dielectric selected from the group consisting of hafnium and tantalum compounds;
    forming a resist over the capacitor stack;
    patterning the resist to form a mask;
    etching the capacitor stack to form the high density capacitor using the mask;
    ashing the resist to leave an ash residue; and
    then, cleaning the high density capacitor with a plasma comprising fluorine-containing radicals.

2. The method of claim 1, further comprising cleaning the high density capacitor with a solvent.

3. The method of claim 2, wherein the solvent clean comes before the plasma clean.

4. The method of claim 2, wherein the plasma clean comes before the solvent clean.

5. The method of claim 1, wherein the capacitor stack comprises an electrode layer comprising a material selected from the group consisting of TiN, TaN, TiAlN, TiAlON, and $IrO_2$.

6. The method of claim 1, wherein the substrate comprises one or more tungsten plugs within an electrically insulating material.

7. The method of claim 1, wherein the plasma further comprises oxygen-containing radicals.

8. A method of cleaning sidewalls of a capacitor comprising a dielectric core comprising a dielectric selected from the group consisting of ferroelectric materials, hafnium compounds, and tantalum compounds, comprising:
    etching the sidewalls with a plasma comprising fluoride radicals.

9. The method of claim 8, further comprising cleaning the sidewalls with a solvent.

10. The method of claim 8, wherein the capacitor comprises an electrode comprising a material selected from the group consisting of TiN, TaN, TiAlN, TiAON, and $IrO_2$.

11. The method of claim 8, wherein the dielectric core comprises $Ta_2O_5$, $HfO_2$, or $HfSiO_4$.

12. The method of claim 8, wherein the plasma further comprises oxygen-containing radicals.

13. A method of cleaning a high density capacitor having sidewalls, comprising:
    providing a capacitor stack on a substrate, the capacitor stack comprising a dielectric selected from the group consisting of hafnium and tantalum compounds, a top electrode layer, and a bottom electrode layer;
    etching the top electrode layer, dielectric, and bottom electrode layer of the capacitor stack to form the high density capacitor having sidewalls;
    cleaning the sidewalls with a solvent; and
    after said etching step, plasma etching the sidewalls in an atmosphere comprising at least about 0.1 mole % of a fluorine compound.

14. The method of claim 13, wherein the atmosphere further comprises at least about 10 mole % of an oxygen-containing compound.

15. The method of claim 13, wherein the fluorine compound is $CF_4$.

16. The method of claim 14, wherein the oxidizing compound is $O_2$.

17. The method of claim 13, wherein plasma etching takes place at a pressure at or below about 10 torr.

18. The method of claim 13, wherein plasma etching takes place at a temperature in the range from about 20 to about 100° C.

19. The method of claim 13, wherein the capacitor comprises a core comprising a dielectric selected from the group consisting of $Ta_2O_5$, $HfO_2$, and $HfSiO_4$.

20. The method of claim 13, wherein the capacitor comprises a ferroelectric core.

* * * * *